(12) United States Patent
Ramos De Almeida et al.

(10) Patent No.: US 11,365,982 B2
(45) Date of Patent: Jun. 21, 2022

(54) HUBODOMETER

(71) Applicants: Gilvan Ramos De Almeida, Morungaba (BR); Eduardo Rafael Marques De Lima, São Paulo (BR); Alexei Rios Nicolini, Mogi das Cruzes (BR)

(72) Inventors: Gilvan Ramos De Almeida, Morungaba (BR); Eduardo Rafael Marques De Lima, São Paulo (BR); Alexei Rios Nicolini, Mogi das Cruzes (BR)

(*) Notice: Subject to any disclaimer, the term of this patent is extended or adjusted under 35 U.S.C. 154(b) by 475 days.

(21) Appl. No.: 16/495,292

(22) PCT Filed: Jul. 12, 2017

(86) PCT No.: PCT/BR2017/000072
§ 371 (c)(1),
(2) Date: Sep. 18, 2019

(87) PCT Pub. No.: WO2018/132881
PCT Pub. Date: Jul. 26, 2018

(65) Prior Publication Data
US 2020/0225058 A1    Jul. 16, 2020

(30) Foreign Application Priority Data

Jan. 18, 2017  (BR) .................. 102017001071-6

(51) Int. Cl.
*G01C 22/00* (2006.01)
*G01C 22/02* (2006.01)
(Continued)

(52) U.S. Cl.
CPC ............ *G01C 22/02* (2013.01); *G01D 5/145* (2013.01); *H03K 21/08* (2013.01); *H03K 21/18* (2013.01)

(58) Field of Classification Search
None
See application file for complete search history.

(56) References Cited

U.S. PATENT DOCUMENTS 4,989,222 A    1/1991  Lutts et al.
5,524,034 A    6/1996  Srygley et al.
(Continued)

OTHER PUBLICATIONS

International Search Report (PCT/ISA/210) dated Oct. 3, 2017, by Brazil the Patent Office as the International Searching Authority for International Application No. PCT/BR2017/000072.
(Continued)

*Primary Examiner* — Tuan T Lam
(74) *Attorney, Agent, or Firm* — Buchanan Ingersoll & Rooney PC

(57) ABSTRACT

A hubodometer for attachment to a wheel hub comprising an outer housing enclosing equipment for measuring distance travelled based on the wheel hub's number of revolutions, and a NFC-based communications link for transmitting to an external unit data related to the measured distance and for receiving operational data such as the diameter of the vehicle's wheel, and the position of the hub to which the hubodometer is attached. The equipment comprises a first electronic assembly conjoined with the outer housing and a second assembly comprising an anti-rotation pendulum provided with two permanent magnets of opposing polarities, the positions of which subtend an angle smaller than 180 degrees. The first electronic assembly comprises a bipolar Hall sensor moving in a circular path that traverses North and South fields of the magnets, whose output signal is a rectangular wave in which different mark-to-space ratios are associated with forward or reverse travel direction.

12 Claims, 4 Drawing Sheets

(51) Int. Cl.
*G01D 5/14* (2006.01)
*H03K 21/08* (2006.01)
H03K 21/18 (2006.01)

(56) References Cited

U.S. PATENT DOCUMENTS

| | | | |
|---|---|---|---|
| 5,673,018 A | 9/1997 | Lowe et al. | |
| 6,011,827 A * | 1/2000 | Kyrtsos | G01C 22/02 377/16 |
| 6,547,128 B1 * | 4/2003 | Shimura | G01C 22/00 235/95 B |
| 6,646,432 B1 * | 11/2003 | Malinowski | A63C 17/26 324/171 |
| 10,697,793 B2 * | 6/2020 | Stewart, Jr. | G01P 3/44 |
| 2004/0083811 A1 | 5/2004 | Kranz | |
| 2021/0164803 A1 * | 6/2021 | Shepheard | G01C 22/00 |
| 2021/0396544 A1 * | 12/2021 | Guo | G01C 22/00 |

OTHER PUBLICATIONS

Written Opinion (PCT/ISA/237) dated Oct. 3, 2017, by the Brazil Patent Office as the International Searching Authority for International Application No. PCT/BR2017/000072.

* cited by examiner

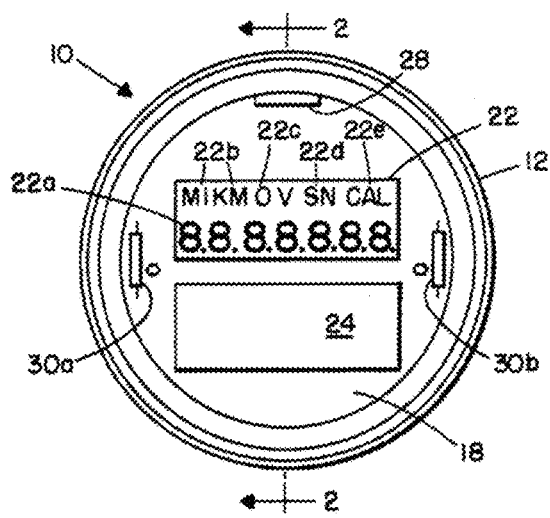
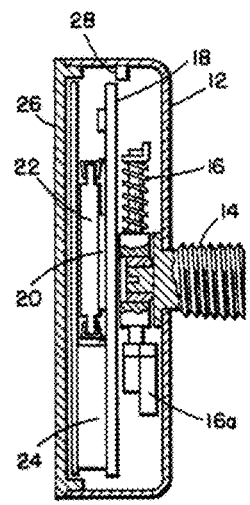
*Fig. 1 (previous art)*  *Fig. 2 (previous art)*
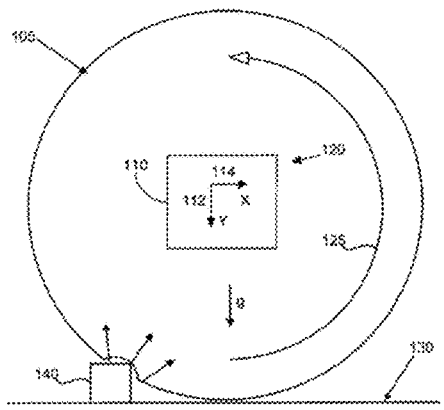
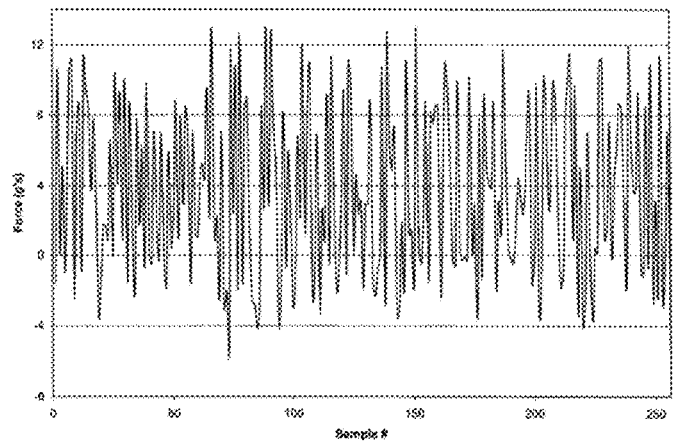
*Fig. 3 (previous art)*  *Fig. 4 (previous art)*
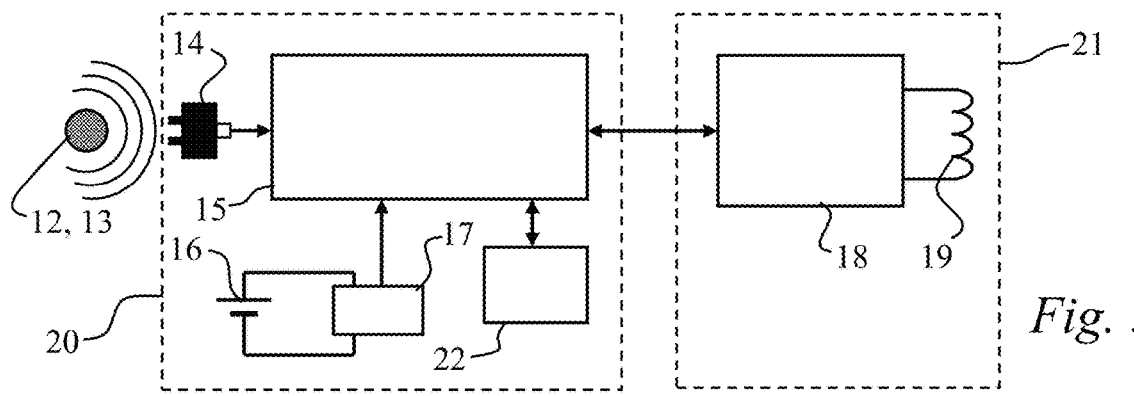
*Fig. 5*

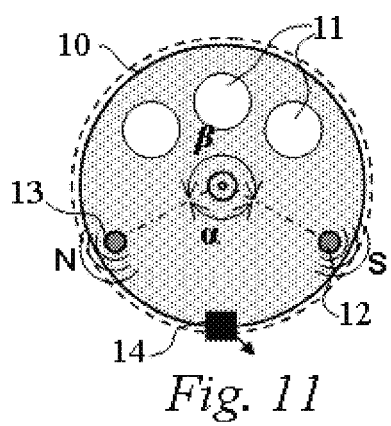
Fig. 11
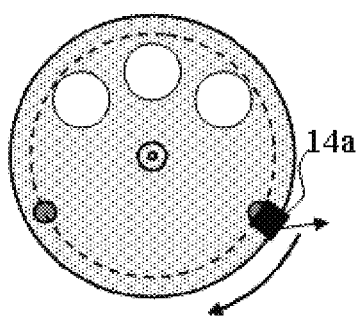
Fig. 12-a
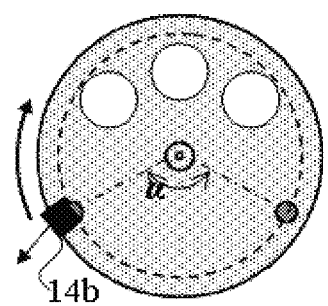
Fig. 12-b
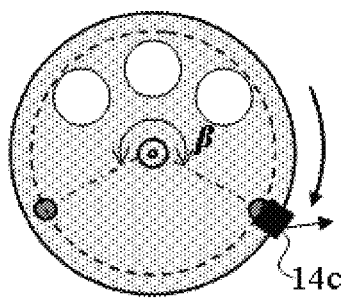
Fig. 12-c
Fig. 12-d
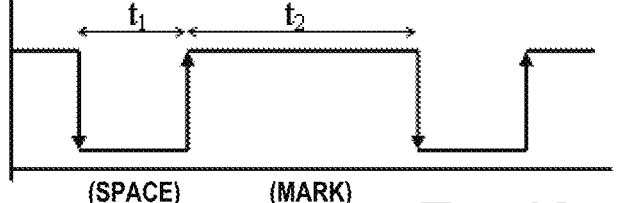
Fig. 12-e
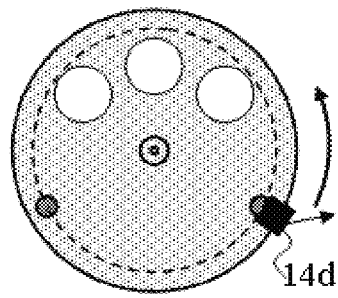
Fig. 13-a
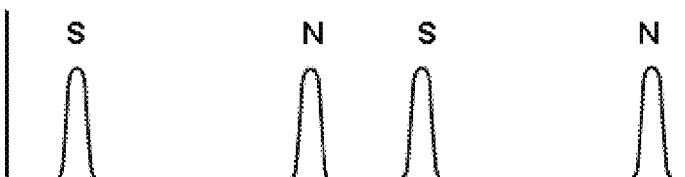
Fig. 13-c
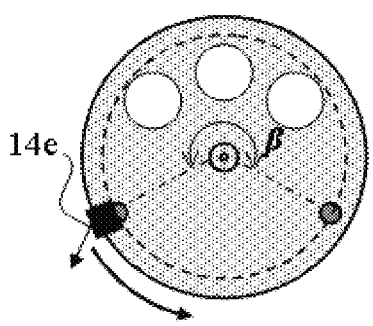
Fig. 13-b
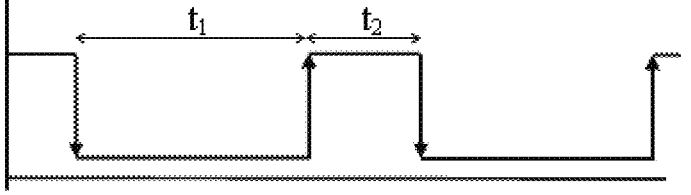
Fig. 13-d

HUBODOMETER

FIELD OF THE INVENTION

The present invention relates generally to a device commonly known as a hubodometer, employed for measuring the distance traveled by vehicles such as trucks, trailers and semi-trailers, tractors, or the like.

BACKGROUND OF THE INVENTION

Fleet maintenance procedures, leasing agreements or the like, and/or certain governmental regulations require the use of a device to accurately record the distance traveled by a commercial vehicle. Such a device, commonly known as a hubodometer, is typically bolted or otherwise attached to a wheel hub of the vehicle where it senses rotation of the wheel, the sensed rotation being correlated with the distance traveled as a function of the external diameter of the wheel.

Considering that this distance information is used for several kinds of control, such as fuel consumption, tire wear, trip report, and so on, it is imperative that the recording device be manufactured in a manner which prevents intentional or inadvertent alteration of the distance information. It is also imperative that the recording device be immune to the effect of wheel impacts when driving over rough surfaces or rocks, in order that such movements are not interpreted as a rotation of the wheel hub.

One such hubodometer is disclosed in U.S. Pat. No. 4,989,222 entitled Electronic Hubodometer which is depicted in FIGS. 1 and 2 of the present application. This hubodometer comprises an outer housing 12 having a permanent magnet 28 affixed thereto, attached to the hub of a wheel and rotating therewith. A pendulous element 16 provided with an anti-rotation weight 16a, to which a printed circuit board 18 is attached. Said printed circuit board comprises electronic components, such as a microcontroller, a display module 22 and a battery 24 as well as reed switches 30a and 30b actuated by magnetic fields. When the vehicle moves the axle hub is rotated and housing 12 is rotated associatively therewith.

Consequently, permanent magnet 28 will pass by said reed switches which are alternately actuated. The microcontroller accumulates the number of sensed rotations and drives display 22 which will show the relevant information such as the traveled mileage.

The shortcomings of the aforementioned device include the lack of confidentiality of the information and the fragility of the display window. Moreover, the reed switches are subject to wear and have a limited life span.

Another known hubodometer is described in U.S. Pat. No. 2004083811 entitled Electronic Hubodometer, shown in FIGS. 3 and 4 of the present application. Instead of devices containing moving parts, this invention uses a dual axis accelerometer which detects force along two orthogonal axes, an x-axis 114 and a y-axis 112. When the wheel is spinning, such accelerometers provide an alternately positive and negative signal, due to the action of gravity on them. However, such a device is sensitive to road irregularities, so that the signal produced—shown in FIG. 4—which requires a rather complex processing for reliable interpretation of the captured data.

OBJECTS OF THE INVENTION

In view of the foregoing it is an object of the invention to provide a reliable hubodometer that is highly resistant to external influences that might impair the distance information therein recorded.

It is another object of the invention to insure the reliability of the information provided by making the device immune from shock and vibration, which are adverse conditions arising from road irregularities or off-road surfaces, as well as small deviations due to wheel misbalancing or off-center hubodometer attachment to the wheel hub.

It is yet another object to determine whether the vehicle is travelling forward or backward, which allows differentiated distance records for each condition.

It is yet another object to insure the confidentiality of information, restricting its disclosure only to authorized personnel.

SUMMARY OF THE INVENTION

The foregoing objects are achieved and other advantages are realized by a hubodometer for attachment to a vehicle's wheel structure comprising an outer housing formed by a base provided with means for attachment to a wheel hub and a protective cover of strong visually opaque material, permeable to electromagnetic radiation, removably coupled to the hub of the wheel, with the equipment housed therein being provided with a NFC-based bi-directional communications link for transmitting and receiving information to and from an external unit.

According to another feature of the invention, said external unit may be a commercially available apparatus, such as, for example, a cellphone or tablet, in which NFC technology is incorporated. Therefore, it is not necessary to use dedicated devices; any apparatus equipped with NFC technology will do, as long as it is provided with the specific software.

According to another feature of the invention, the communications link between the hubodometer and said external unit is set up automatically by the close approximation of said external unit to the hubodometer.

According to another feature of the invention the information sent from the hubodometer via NFC to said external unit comprises data relating to the distance traveled by the vehicle.

According to another feature of the invention the information sent from said external unit to the hubodometer via NFC technology comprises data relating to the setting up of the hubodometer.

According to another feature of the invention, said data, sent by said external unit to the hubodometer through said NFC technology communications link, comprises a factor related to the tire diameter of the vehicle wheel as well as operational data comprising, among others, the vehicle identification, the identification of the hubodometer, the position of the hub where it is attached, the date of installation in the vehicle, the calibration parameters of the device, and the date of last reading.

According to another feature of the invention, the total memory content of a first hubodometer may be copied via NFC communications link to the memory of said external unit, where it remain available for copying into another hubdometer. This feature makes it possible to clone the characteristics and data stored in the memory of said first hubodometer to a second one, allowing the replacement of a hubodometer with a new unit without loss of information and historical data previously registered by the first one.

According to another feature of the invention, the equipment inside the housing comprises an anti-rotation pendulum device, provided with at least two permanent magnets arranged in a counter-polar fashion, suspended by a spindle supported by two bearings of very low friction, and an electronic assembly conjoined with the housing comprising a bipolar Hall sensor associated with a processor and a memory, and an NFC transceiver and respective antenna for bi-directional exchange of information with an external unit.

According to a further feature of the invention, said bipolar Hall sensor rotates integrally with the hub of the wheel, cyclically traversing the North and South magnetic fields of said magnets and generating electric pulses as a function of its passage through said magnetic fields.

According to another feature of the invention, the output of said bipolar Hall sensor is a rectangular wave having two logic states, 0 or 1, the transition from one state to the other occurring only when there is a sequential reversal of polarity of the traversed magnetic fields. In the absence of a magnetic field the output state of the Hall element remains in the last stimulated state.

Thus, any pulses generated by the repeated traversing of the bipolar Hall sensor in front of only one of the magnets, be it of polarity N or S, due to eventual oscillations of the pendulum element, will not be recorded as complete turns of the wheel. In order for this to occur, the Hall sensor must pass through two magnetic fields of opposed polarities. This only occurs when the Hall sensor traverses sequentially through an N-polarity field followed by traversing the S-polarity field, or vice versa.

According to another feature of the invention, said magnets are arranged on the circumference of a circle whose center is the suspension spindle of the pendulum element, the positions of said magnets subtending an angle of less than 180 degrees. In other words, said magnets are not arranged at the ends of a diameter of said circle.

According to another feature of the invention, when the vehicle is in motion the output of the bipolar Hall sensor is an asymmetric rectangular wave between the logic levels 1 and 0, i.e. with different mark to space ratios, enabling the processor to differentiate between the forward and the rearward displacement of the vehicle.

According to another feature of the invention, the absence of visual indication insures the safety and inviolability of the information provided by the hubodometer as well as greater mechanical robustness of the assembly.

BRIEF DESCRIPTION OF THE DRAWINGS

For a more complete understanding of the present invention and the advantages thereof, reference is now made to the following exemplary non-limiting description, taken in conjunction with the accompanying drawings.

FIGS. 1, 2, 3 and 4 illustrate hubodometers built according to the known art.

FIG. 5 shows the simplified block diagram of the hubodometer of the invention.

FIG. 11 shows the pendulum element in a preferred embodiment of the hubodometer.

FIGS. 12a to 12e illustrate the behavior of the sensing assembly when the vehicle wheel rotates clockwise.

FIGS. 13a to 13d illustrate the behavior of the sensing assembly when the vehicle wheel rotates counterclockwise.

DETAILED DESCRIPTION OF A PREFERRED EMBODIMENT

Figure 6:
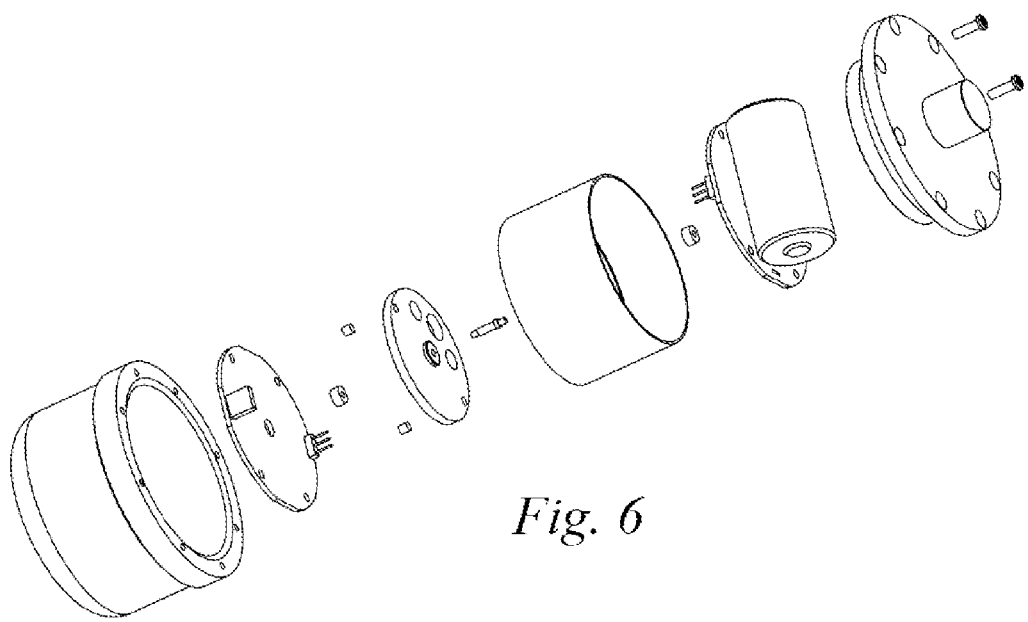
FIG. 6 is an exploded view of the hubodometer of the invention.

Referring now to FIG. 11, which depicts the pendulum element 10, it comprises a disc of non-magnetic material in which uneven mass distribution is provided by openings 11 so as to render the upper portion lighter than the bottom one. Said disc is provided with a central supporting pivot, the ends of which are inserted in two bearings of very low friction (not shown in the figure), thus ensuring the permanence of the disc in a substantially vertical position, as shown in the figure, independently of the rotation, in any direction, of the hub to which said hubodometer is attached.

Said disc is provided with two permanent magnets 12 and 13, oriented in an opposing manner: magnet 12 has its South pole facing the viewer while magnet 13 has the North pole facing away from the viewer. As shown in FIG. 11, said magnets are located on the circumference of a circle whose center is said support spindle, the positions of said magnets subtending an angle $\alpha < 180°$. In other words, said magnets are not placed at the ends of a diameter of said circle.

FIG. 11 further shows the bipolar Hall sensing element 14, which is mounted on a printed circuit board conjoineed with the hubodometer housing (not shown in that figure).

Upon rotation of the hubodometer due to the displacement of the vehicle, the bipolar Hall sensor will move in a circle (dashed line in the drawing), traversing alternately the fields of polarity N and S of said permanent magnets.

Due to this displacement, at the output of the bipolar Hall sensor will appear a rectangular signal consisting of a sequence of transitions between two logical levels 0 and 1. Said transitions occur whenever there is the sequential passage through two opposing fields, S→N or N→S. The logical output level remains unchanged if the Hall sensor does not traverse fields of opposing polarities.

Thus, in the case of an oscillation that does not correspond to a complete rotation of the wheel hub, the bipolar Hall sensor may repeatedly traverse the same magnetic field, for instance, in sequences (N→N→N→N) or (S→S→S→S) the output level, be it 1 or 0, will remain unchanged and the system will not register a complete rotation of the wheel.

FIG. 12 shows what happens when the rotation occurs clockwise. In FIG. 12-a, the bipolar Hall sensor first faces the S pole, and its output passes to logic level 0, as shown in FIG. 12-e.

As the rotation of the vehicle wheel proceeds, the bipolar Hall sensor travels through the angle $\alpha$ reaching the magnetic field of polarity N of magnet 13 (FIG. 12-b), when the voltage at the output of this sensor goes to logic level 1, as shown in FIG. 12-e.

As the rotation progresses, as shown in FIG. 12-c, the bipolar Hall sensor 14 completes the turn by traversing angle $\beta > \alpha$ and faces again the S field, producing a transition from level 1 to level 0 in its output.

Thus, in the case of clockwise direction of rotation of the wheel, the output of the bipolar Hall sensor consists of a rectangular wave in which the duration of the space t1, corresponding to level 0, is less than the mark duration t2 corresponding to level 1, that is, mark-to-space ratio is greater than 1 or t1<t2.

When the rotation is counterclockwise, the behavior of the assembly illustrated in FIGS. 13-a to 13-d is shown. In this case, space t1 is greater than mark t2, the mark-to-space ratio being less than 1, or t1>t2, which enables the system to differentiate between forward and reverse movement of the vehicle.

In FIG. 5 the block diagram of the electronic circuit is depicted in simplified form. In this figure, 14 is the bipolar Hall sensor, the output of which is connected to the processor 15, which is powered by the battery 16 and the regulator 17. Said processor is connected to a memory 22 and an NFC transceiver 18, whose antenna is coil 19.

In the exemplary embodiment now being described, the electronic components are mounted on two printed circuit boards 20 and 21, both conjoined to the hubodometer case and rotating together with the wheel axle. However, in alternative embodiments remaining within the spirit of the invention all the electronic components may be assembled in a single board.

Figure 14:
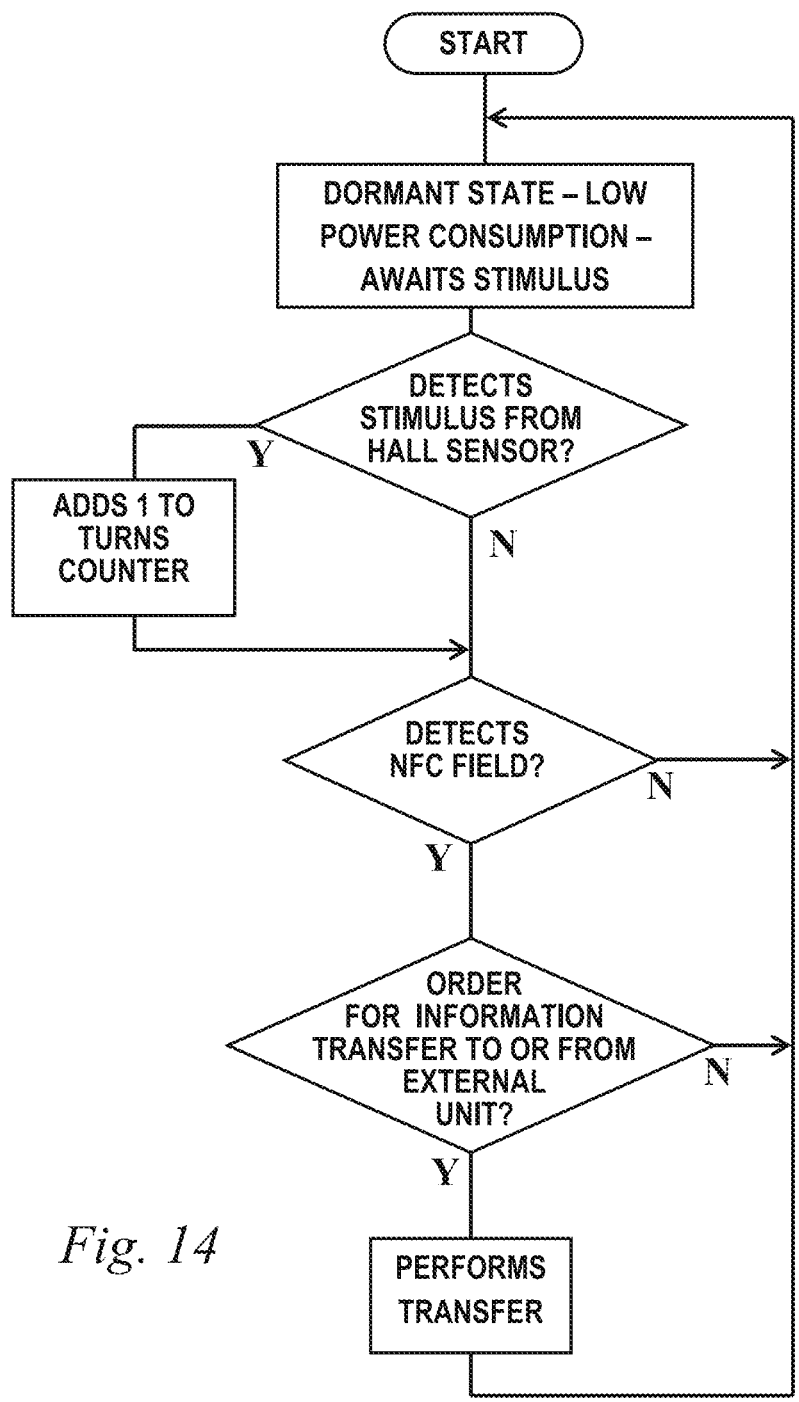
FIG. 14 shows the flowchart of the processor operation.

The system operates according to the flowchart of FIG. 14. Typically, the processor remains in a dormant condition, when power consumption is extremely low. It leaves this state either by a stimulus coming from the Hall sensor or by the detection of an electromagnetic field of the NFC type. In the latter case, the connection between the external unit and the hubodometer is established automatically, once the external unit is drawn near the hubodometer, there being no need of additional procedures.

Upon receiving a pulse from the bipolar Hall sensor, indicating that the wheel has completed one revolution, the processor adds one unit to the total number of turns stored in the memory 22, returning immediately to the dormant condition.

The turn totalizer may contain two registers, the first one for movement in the forward direction and the second in the reverse direction. Thus, when space t1 is less than mark t2 one unit will be added to the forward direction register, while one unit will be added to the reverse direction register when (t1>t2).

According to the invention, the processor may interpret the data collected by the bipolar sensor Hall, for example by calculating the distance traveled, by multiplying the number of revolutions by a factor previously uploaded through the NFC communications link.

When stimulated by the NFC field, the processor exits the dormant state and, after interpreting the content of the query sent by the external unit placed close to the hubodometer, performs the corresponding operation. Such operation may consist of transmitting, the data corresponding to the distance traveled by the vehicle. Another possibility is receiving initialization or updating data, such as, for example, the diameter of the tire, said information being stored in memory 22. Once the operation is performed, the processor returns to the dormant state, in which the power drawn from the battery is minimal.

Among the data exchanged with said external unit are the following:
- distance traveled, the calculation of which is performed using the pulse count of the bipolar sensor Hall multiplied by a factor that is a function of the tire diameter used. Thus, for example, for a tire with 86 cm diameter this factor is approximately 2.7 meters; therefore, if the pulse total equals 10,000, it means that the vehicle has traveled 27 km;
- uploading the tread diameter of the vehicle wheel, which may be updated due to tread wear;
- date of installation on the vehicle, vehicle identification, date of last reading, and so on;
- amount charge of the battery, allowing its eventual replacement when necessary;
- cloning of characteristics and data stored in memory from one device to another, allowing the replacement of a hubodometer by a new unit without loss of historical information and data recorded by the previous one.

In a preferred embodiment of the invention the exchange of information between the hubodometer and the external environment is done by means of a portable device, such as a cellphone or tablet, provided with NFC functionality. An important advantage of using NFC technology lies in its limited range of a few decimeters, which reduces the possibility of data being stolen by a third party Also, the communication protocol between the hubodometer and the external unit may be structured so as to limit the possibility of tampering with the stored or exchanged information. This can be achieved by using passwords specific to each function. Thus, a first password may enable the reading by the external unit of the data stored in the hubodometer's memory while preventing the erasure of said information. A second password may allow the updating of parameters stored in memory from information transmitted by the external unit, while preventing any alteration of the data related to the traveled mileage stored in that memory, and so forth.

Figure 7:
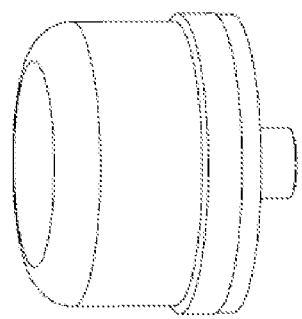
FIGS. 7, 8, 9 and 10 illustrate various views of the hubodometer, including components housed within the housing.
Figure 8:
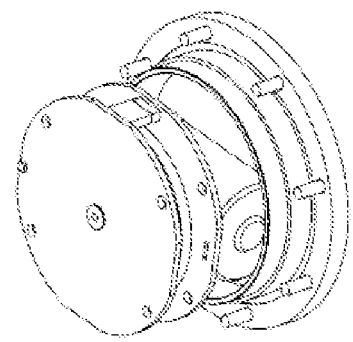
Figure 9:
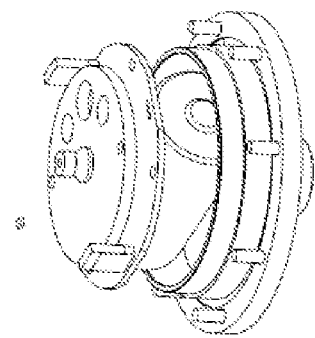
Figure 10:
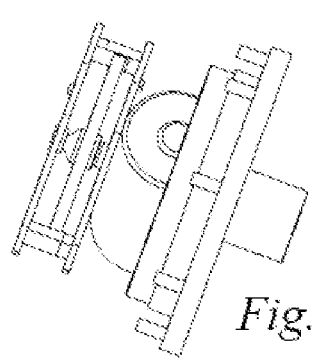

FIG. 7 is an exploded view of the hubodometer, and FIGS. 7 to 10 are partial views of the internal arrangement of the components, where the following elements can be seen:
- first printed circuit board that performs rotation measurement by means of a Hall effect bipolar sensor;
- second printed circuit board housing the electronics and the antenna responsible for NFC communication;
- disk that behaves like a pendulum, which remains static (i.e. does not rotate) and supports the two permanent magnets;
- the support spindle of the disc, which keeps it suspended;
- very low friction ball bearings fixed to the two printed circuit boards that insure the rotation of said spindle with negligible friction;
- two opposing magnets that will activate the bipolar Hall sensor mounted on the first printed circuit board;
- spacer ring, which serves as support for the two printed circuit boards;
- bipolar Hall sensor, Hall-effect magnetic field sensor;
- long-life non-rechargeable battery;
- supporting base provided with a threaded stud for fastening to the wheel hub;
- cover of visually opaque strong material, permeable to electromagnetic NFC communications field;
- screws for securing the cover to the base.

Although the preferred embodiment of the present invention has been described in detail, it should be understood that various changes, substitutions and alterations can be made therein without departing from the spirit and scope of the invention as defined by the appended claims.

The invention claimed is:

1. A hubodometer for measuring distance traveled by vehicles of various types based on a wheel rotations counting device that counts rotations of a wheel of the vehicle, the hubodometer comprising a rigid protective cover and a revolvable base provided with means for attachment to a wheel hub, said hubodometer also comprising a non-magnetic disc-shaped pendulum holding a pair of permanent magnets arranged to subtend an angle of less than 180 degrees, and being provided with means for exchanging information with an external unit via an NFC electromagnetic link, said magnets being oriented with opposing polarities and an electronic assembly is provided which comprises a bipolar Hall sensor connected to a processor as well as other electronic components, mounted on at least one printed circuit board, wherein said bipolar Hall sensor output is an asymmetrical rectangular wave transitioning between the logical levels "0" and "1", said wave being produced by the traversal of said bipolar Hall sensor through the opposite-polarity magnetic fields of said magnets, a transition between said logical "0" and "1" levels being conditional on sequential passage of said Hall sensor through the magnetic fields of opposite polarities, ether north to south or South to North, and said processor operating in hibernation in an absence of signals from said bipolar Hall sensor.

2. A hubodometer as claimed in claim 1, wherein said disc-shaped pendulum is of non-magnetic material and has a circular shape, being suspended by a spindle and at least one very low friction bearing; a static orientation of said pendulum in a substantially vertical position being provided by uneven distribution of its masses above and below an axis of said spindle, said uneven distribution consisting of at least one hollow region above said axis.

3. A hubodometer as claimed in claim 1, wherein said bipolar Hall sensor sequentially traverses the magnetic fields of opposite polarities of said permanent magnets at each complete rotation of the hubodometer, regardless of conditions of pavement on which the vehicle is travelling.

4. A hubodometer as claimed in claim 1, wherein the logic output level of said bipolar Hall sensor remains unchanged when the pendulum element oscillates due to irregularities of pavement on which the vehicle is travelling, and the bipolar Hall sensor sequentially crosses a magnetic field of the same polarity, wherein a complete turn of the wheel is not recorded.

5. A hubodometer as claimed in claim 3, wherein a cycle of said rectangular wave has a duration (t1) of logic portion "0" less than the duration (t2) of logic portion "1" when the bipolar Hall sensor rotates, in concert with rotation of an axle of the wheel, is in a clockwise direction.

6. A hubodometer as claimed in claim 3, wherein a cycle of said rectangular wave has a duration (t1) of logic portion "0" greater than the duration (t2) of logic portion "1" when the bipolar Hall sensor rotates, in concert with rotation of an axle of the wheel, is in a counterclockwise direction.

7. A hubodometer as claimed in claim 1, wherein a cycle of said rectangular wave has a duration (t1) of logic portion "0" and a duration (t2) of logic portion "1" when the bipolar Hall sensor rotates, and further comprising a turns totalizer containing first and second registers, the first register for forward movement in a forward direction and the second register for backwards movement in a backward direction, a wheel turn count being incremented by one when a complete cycle of said rectangular wave is completed, comprising either a sequence (t1+t2) or a sequence (t2+t1), and the first register being incremented by one unit when (t1<t2), and the second register being incremented by one unit when (t1>t2).

8. A hubodometer as claimed in claim 7, wherein a value of mileage traveled by the vehicle in the forward direction is a product of total wheel turns accumulated in said first register by a factor related to a diameter of a tire of the vehicle, when (t1<t2).

9. A hubodometer as claimed in claim 7, wherein a value of the mileage traveled by the vehicle in the backward direction is calculated from a product of a total wheel turns accumulated in said second register by a factor related to a diameter of a tire of the vehicle, when (t1>t2).

10. A hubodometer as claimed in claim 1, wherein the hubodometer is a first hubodometer and is configured to provide cloning of the first hubodometer to a second hubodometer by transferring to the external unit via the NFC link all the information stored in memory of said first hubodometer and later copying, via the NFC link, said information to the second hubodometer.

11. A hubodometer as claimed in claim 10, wherein said information includes content comprising mileage data as well as historical data previously recorded in the memory of said first hubodometer.

12. A hubodometer as claimed in claim 1, wherein said external unit is selected from the group of commercially available equipment comprising mobile phones or tablets incorporating NFC technology, said equipment being provided with specific software.

* * * * *